United States Patent
Fujita et al.

(10) Patent No.: US 9,287,520 B2
(45) Date of Patent: Mar. 15, 2016

(54) ORGANIC EL ELEMENT, ORGANIC EL PANEL HAVING ORGANIC EL ELEMENT, ORGANIC EL LIGHT-EMITTING APPARATUS, AND ORGANIC EL DISPLAY APPARATUS

(71) Applicant: JOLED INC., Tokyo (JP)

(72) Inventors: Hirofumi Fujita, Ehime (JP); Yoshiaki Tsukamoto, Osaka (JP); Shinya Fujimura, Osaka (JP); Satoru Ohuchi, Osaka (JP)

(73) Assignee: JOLED INC., Tokyo (JP)

( * ) Notice: Subject to any disclaimer, the term of this patent is extended or adjusted under 35 U.S.C. 154(b) by 75 days.

(21) Appl. No.: 14/047,392

(22) Filed: Oct. 7, 2013

(65) Prior Publication Data

US 2014/0034937 A1 Feb. 6, 2014

Related U.S. Application Data

(63) Continuation of application No. PCT/JP2013/001738, filed on Mar. 14, 2013.

(30) Foreign Application Priority Data

Apr. 27, 2012 (JP) .................................. 2012-102944

(51) Int. Cl.
*H01L 51/50* (2006.01)
*H01L 51/52* (2006.01)

(52) U.S. Cl.
CPC ............ *H01L 51/5088* (2013.01); *H01L 51/52* (2013.01); *H01L 51/5096* (2013.01); *H01L 2251/552* (2013.01)

(58) Field of Classification Search
CPC .................................................... H01L 21/5088
USPC ............................................................ 257/40
See application file for complete search history.

(56) References Cited

U.S. PATENT DOCUMENTS

| | | | |
|---|---|---|---|
| 5,443,922 | A | 8/1995 | Nishizaki et al. |
| 5,981,092 | A | 11/1999 | Arai et al. |
| 2002/0158242 | A1 | 10/2002 | Son et al. |
| 2004/0113547 | A1 | 6/2004 | Son et al. |
| 2004/0164294 | A1 | 8/2004 | Son et al. |

(Continued)

FOREIGN PATENT DOCUMENTS

| | | |
|---|---|---|
| JP | 5-163488 | 6/1993 |
| JP | 9-260063 | 10/1997 |

(Continued)

OTHER PUBLICATIONS

International Search Report (ISR) in International Application No. PCT/JP2013/001738, dated Jun. 18, 2013.

(Continued)

*Primary Examiner* — Yu-Hsi D Sun
(74) *Attorney, Agent, or Firm* — Greenblum & Bernstein, P.L.C.

(57) ABSTRACT

An organic EL element includes: an anode; a cathode; a buffer layer; and a hole injection layer between the anode and the buffer layer, the hole injection layer including a nickel oxide including both nickel atoms with a valence of three and nickel atoms with a valence of two. In the hole injection layer, a ratio of the number of nickel atoms with a valence of three to the number of nickel atoms with a valence of two, expressed in percentage, is equal to or greater than 60%.

6 Claims, 9 Drawing Sheets

(56) References Cited

U.S. PATENT DOCUMENTS

| | | |
|---|---|---|
| 2004/0169175 A1 | 9/2004 | Son et al. |
| 2005/0170208 A1 | 8/2005 | Yatsunami et al. |
| 2006/0038484 A1 | 2/2006 | Noh et al. |
| 2007/0102698 A1 | 5/2007 | Kang et al. |
| 2007/0257605 A1 | 11/2007 | Son et al. |
| 2008/0001532 A1 | 1/2008 | Son et al. |
| 2009/0072723 A1 | 3/2009 | Shioya |
| 2009/0160325 A1 | 6/2009 | Yatsunami et al. |
| 2011/0079817 A1* | 4/2011 | Ohara ............................ 257/103 |
| 2011/0127510 A1 | 6/2011 | Seo et al. |
| 2012/0007064 A1 | 1/2012 | Noh et al. |
| 2012/0061656 A1 | 3/2012 | Ohuchi et al. |
| 2012/0132934 A1 | 5/2012 | Ohuchi et al. |
| 2013/0056719 A1 | 3/2013 | Komatsu et al. |
| 2013/0119366 A1 | 5/2013 | Nishiyama et al. |
| 2013/0126840 A1 | 5/2013 | Fujimura et al. |
| 2013/0126843 A1 | 5/2013 | Nishiyama et al. |
| 2013/0126846 A1 | 5/2013 | Harada et al. |
| 2013/0126848 A1 | 5/2013 | Harada et al. |
| 2013/0140542 A1 | 6/2013 | Harada et al. |
| 2013/0140543 A1 | 6/2013 | Harada et al. |
| 2013/0285042 A1 | 10/2013 | Komatsu et al. |
| 2013/0299798 A1 | 11/2013 | Seo et al. |
| 2013/0313543 A1 | 11/2013 | Ohuchi et al. |
| 2013/0328039 A1 | 12/2013 | Ohuchi et al. |

FOREIGN PATENT DOCUMENTS

| | | |
|---|---|---|
| JP | 2003-519432 | 6/2003 |
| JP | 2004-119201 | 4/2004 |
| JP | 2005-260094 | 9/2005 |
| JP | 2008-016868 | 1/2008 |
| JP | 2009-060012 | 3/2009 |
| JP | 2011-044445 | 3/2011 |
| JP | 2011-139044 | 7/2011 |

OTHER PUBLICATIONS

I-Min Chan et al., "Enhanced hole injections in organic light-emitting devices by depositing nickel oxide on indium tin oxide anode", Applied Physics Letters 81, p. 1899 (2002).

Jens Meyer et al., "Transparent Inverted Organic Light-Emitting Diodes with a Tungsten Oxide Buffer Layer", Advanced materials 20, pp. 3839-3843 (2008).

* cited by examiner

ORGANIC EL ELEMENT, ORGANIC EL PANEL HAVING ORGANIC EL ELEMENT, ORGANIC EL LIGHT-EMITTING APPARATUS, AND ORGANIC EL DISPLAY APPARATUS

CROSS REFERENCE TO RELATED APPLICATION

This is a continuation application of PCT Application No. PCT/JP2013/001738 filed Mar. 14, 2013, designating the United States of America, the disclosure of which, including the specification, drawings and claims, is incorporated herein by reference in its entirety.

TECHNICAL FIELD

The present disclosure relates to a structure of an organic electric-field light-emitting element (hereinafter "organic EL element"). In particular, the present disclosure relates to technology for improving hole injection efficiency in a hole injection layer, and to an organic EL panel including the organic EL element, an organic EL light-emitting apparatus, and an organic EL display apparatus.

DESCRIPTION OF THE RELATED ART

In recent years, progress is being made in research and development of diverse functional elements which involve the use of an organic semiconductor. One typical example of a functional element is an organic EL element. An organic EL element is a current-driven light emitting element, and has a pair of electrodes, consisting of an anode and a cathode, and a functional layer layered between the pair of electrodes. The functional layer includes a light-emitting layer composed of an organic material. Upon application of voltage across the pair of electrodes, holes injected from the anode to the functional layer recombine with electrons injected from the cathode to the functional layer. The recombination causes the phenomenon of electroluminescence, which involves emission of light. Being self-luminescent, an organic EL element is highly visible. In addition, being completely solid, an organic EL element has excellent impact resistance. Owing to these advantages, more attention is being given to the applications of organic EL elements as light-emitting elements or a light source for various organic EL display panels and organic EL display apparatuses.

In order to improve the luminous efficiency of an organic EL element, it is helpful to inject carriers (i.e., holes and electrons) from the pair of electrodes to the functional layer. Generally, provision of an injection layer between each of the electrodes and the functional layer is effective in realizing efficient injection of carriers to the functional layer, since an injection layer has a function of lowering the energy barrier during the injection. Accordingly, an electron injection layer is provided between the functional layer and the cathode. For example, an electron injection layer is composed of an organic material, such as a metal complex or oxadiazole, of a metal, such as barium, or of crystal resulting from ionic bonding, such as sodium fluoride. Also, a hole injection layer is provided between the functional layer and the anode. For example, a hole injection layer is composed of an organic material, such as copper phthalocyanine or PEDOT (conductive polymer), or of a metal oxide, such as tungsten oxide ($WO_x$) or nickel oxide ($NiO_x$) (Patent Literature 1, and Non-Patent Literature 1). In particular, it has been reported that an organic EL element having a hole injection layer composed of a metal oxide that includes a transition metal atom, such as $NiO_x$, has improved hole injection efficiency and a long life (Patent Literature 2, and Non-Patent Literature 2).

CITATION LIST

Patent Literature

[Patent Literature 1]
Japanese Patent Application Publication No. 2011-044445
[Patent Literature 2]
Japanese Patent Application Publication No. H9-260063

Non-Patent Literature

[Non-Patent Literature 1]
Jens Meyer et al., Advanced materials 20, 3839-3843 (2008)
[Non-Patent Literature 2]
I-Min Chan et al., Applied Physics Letters 81, 1899 (2002)

SUMMARY

Concerning the conventional organic EL element as described above, there is a demand for further improvement of the hole injection efficiency in order for the organic EL element to emit light with higher intensity.

In view of the above problem, one non-limiting and exemplary embodiment provides an organic EL element with further improved hole injection efficiency.

In one general aspect, the techniques disclosed here feature an organic EL element, comprising: an anode: a cathode; an organic functional layer between the anode and the cathode, the organic functional layer including an organic material; a metal oxide layer between the anode and the organic functional layer, the metal oxide layer including a transition metal oxide including both atoms with a first valence and atoms with a second valence, wherein a transition metal oxide consisting of the atoms with the first valence is higher in conductivity than a transition metal oxide consisting of the atoms with the second valence, and in the metal oxide layer, a ratio of the number of atoms with the first valence to the number of atoms with the second valence, expressed in percentage, is equal to or greater than 60%.

The organic EL element according to one aspect of the present disclosure has further improved hole injection efficiency.

These general and specific aspects may be implemented using a manufacturing method.

Additional benefits and advantages of the disclosed embodiments will be apparent from the specification and figures. The benefits and/or advantages may be individually provided by the various embodiments and features of the specification and drawings disclosed, and need not all be provided in order to obtain one or more of the same.

DETAILED DESCRIPTION

Figure 1:
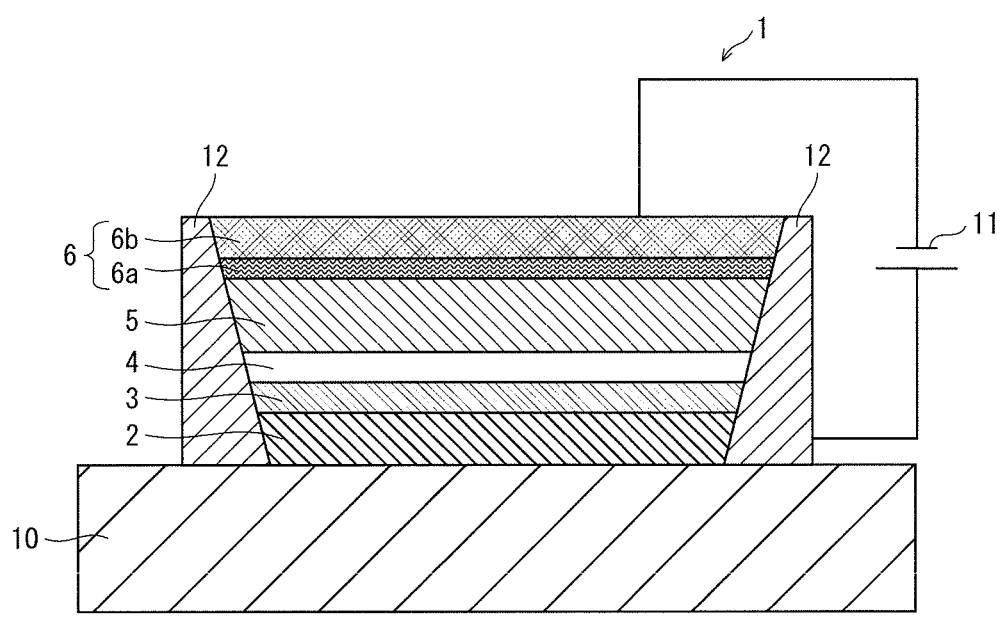
FIG. 1 is a schematic cross-sectional view showing the structure of an organic EL element 1 according to an embodiment.

[Process by which Aspect of the Present Disclosure was Achieved]

Before concretely describing aspects of the present disclosure, the following describes the process by which an aspect of the present disclosure was achieved.

In recent years, various display apparatuses and light sources that include organic EL elements have been widely used. As such, there is an increasing demand for an organic EL element to emit light with higher intensity. In response, the present inventors tried to meet this demand by increasing the number of carriers injected from a pair of electrodes, consisting of a cathode and an anode, to an organic functional layer. Also, among multiple methods for increasing the number of carriers injected from the pair of electrodes to the organic functional layer, the present inventors conducted examination on the improvement of the injection efficiency of holes injected from the anode, which is made of metal, to the organic functional layer via a hole injection layer.

In general, when holes are injected from an anode to an organic functional layer via a hole injection layer, the holes are injected from a Fermi level of the anode, via the highest energy level in a valence band of the hole injection layer (hereinafter "upper end of the valence band"), to the organic functional layer adjacent to the hole injection layer. Note that the valence band of the hole injection layer mainly includes, for example, a 3d orbital component of a transition metal atom M and a 2p orbital component of an oxygen atom. When the anode, which is made of metal, is joined to the hole injection layer, which is made of metal oxide, a relatively large Schottky barrier is formed at the interface between the anode and the hole injection layer.

In order to improve the hole injection efficiency of the organic EL element, it is beneficial to inject as many holes as possible from the anode to the organic functional layer. Accordingly, it is beneficial that many holes cross over the Schottky barrier. In order for holes to be injected from the anode to the hole injection layer across the Schottky barrier, it is beneficial to apply voltage to the organic EL element. The amount of voltage is determined by the magnitude of the Schottky barrier.

The inventors found that, when a hole injection layer is formed from an oxide of a transition metal including atoms with different valences, the conductivity of the oxide of the transition metal is changed by the difference in valence, and the magnitude of the Schottky barrier at the interface between the anode and the hole injection layer is also changed. Based on the above findings, it was confirmed that the hole injection efficiency can be further improved by adjusting the ratio of atoms with different valences in the transition metal included in the hole injection layer such that the conductivity of the oxide of the transition metal constituting the hole injection layer becomes large. An aspect of the present disclosure is achieved by the process as described above.

First, an organic EL element pertaining to an embodiment of the present disclosure is described. Subsequently, results of experiments conducted to confirm the performance of the organic EL element are described, followed by observations on the experimental results. Note that each figure is illustrated on a reduced scale different from the proportion of the actual sizes.

[Outline of an Aspect of the Present Disclosure]

One aspect of the present disclosure is an organic EL element, comprising: an anode: a cathode; an organic functional layer between the anode and the cathode, the organic functional layer including an organic material; a metal oxide layer between the anode and the organic functional layer, the metal oxide layer including a transition metal oxide including both atoms with a first valence and atoms with a second valence, wherein a transition metal oxide consisting of the atoms with the first valence is higher in conductivity than a transition metal oxide consisting of the atoms with the second valence, and in the metal oxide layer, a ratio of the number of atoms with the first valence to the number of atoms with the second valence, expressed in percentage, is equal to or greater than 60%.

This further improves the hole injection efficiency of the organic EL element.

EMBODIMENT

Embodiment 1

1. Structure (Organic EL Element)

The following describes in detail an embodiment of the present disclosure with reference to the drawings. An organic functional layer in the present disclosure includes either one, a combination of two or more, or every one of the following layers: a light-emitting layer that emits light as a result of recombination of holes and electrons, the holes being injected from an anode via a metal oxide layer, and the electrons being injected from a cathode; a hole transport layer that is provided between the metal oxide layer and the light-emitting layer, and that transports the holes injected from the metal oxide layer to the light-emitting layer; and a buffer layer that is provided between the anode and the light-emitting layer, and that prevents the electrons injected from the cathode from entering the anode. In the present embodiment, an example is described in which the organic functional layer includes the buffer layer and the light-emitting layer.

For example, an organic EL element in the present disclosure is an application-type organic EL element, which is manufactured by the application of an organic functional layer through a wet process. The organic EL element includes: an anode; a cathode; an organic functional layer that is provided between the anode and the cathode, and that includes an organic material; and a hole injection layer provided between the anode and the organic functional layer. A direct current power supply is connected to the anode and the cathode, so that the organic EL element is supplied with power from an external source.

FIG. 1 is a schematic cross-sectional view showing the structure of an organic EL element 1 according to the present embodiment.

Specifically, as shown in FIG. 1, the organic EL element 1 includes an anode 2, a hole injection layer 3, a buffer layer 4, a light-emitting layer 5, and a cathode 6 which are sequentially layered on a main surface of a substrate 10. As described above, a direct current power supply 11 is connected to the anode 2 and the cathode 6. The following describes each of the layers in detail.

(Substrate 10)

The substrate 10 is a base material of the organic EL element 1. While not shown in the figures, TFTs (thin film transistors) for driving the organic EL element 1 are formed on a surface of the substrate 10. The substrate 10 is made of alkali-free glass. However, the material of the substrate 10 is not limited to alkali-free glass, and may be formed with an insulating material such as soda glass, nonfluorescent glass, phosphate glass, borate glass, quartz, acrylic resin, styrenic resin, polycarbonate resin, epoxy resin, polyethylene, polyester, silicone resin, and alumina.

(Anode 2)

The anode 2 is formed over the TFT of the substrate 10. The anode 2 is made of ITO (Indium Tin Oxide). The anode 2 has a thickness of 50 nm.

(Hole Injection Layer 3)

The hole injection layer 3 is provided between the anode 2 and the buffer layer 4, and includes an oxide $NiO_x$ of a transition metal Ni that includes nickel atoms with a valence of three as a first valence and nickel atoms with a valence of two as a second valence. The conductivity of the oxide $NiO_x$ when the valence of the transition metal Ni is three (hereinafter "$Ni^{3+}$") is larger than the conductivity of the oxide $NiO_x$ when the valence of the transition metal Ni is two (hereinafter "$Ni^{2+}$"). Also, in the hole injection layer 3, the ratio of the number of atoms of $Ni^{3+}$ to the number of atoms of $Ni^{2+}$ is equal to or greater than 60%.

In the composition formula of $NiO_x$ included in the hole injection layer, x is a real number existing within a range of approximately $0.5 < x < 2$. While it is desirable for the hole injection layer 3 to be formed only from $NiO_x$, the inclusion of a trace level of impurities is acceptable, provided that the amount does not exceed the amount of impurities that might normally be incorporated. The hole injection layer 3 has a thickness of 10 nm. The hole injection layer 3 is formed under predetermined film forming conditions to have the aforementioned structure. Details of the predetermined film forming conditions are described in "Film Forming Conditions of Hole Injection Layer 3" below.

(Buffer Layer 4)

The buffer layer 4 is composed of TFB (poly(9,9-di-n-octylfluorene-alt-(1,4-phenylene-((4-sec-butylphenyl)imino)-1,4-phenylene)), which is an amine-based compound. Forming the buffer layer 4 with an amine-based compound allows for holes conducted from the hole injection layer 3 to be efficiently injected to the functional layer formed above the buffer layer 4. This is because in an amine-based compound, the electron density of HOMO is distributed centering on a lone pair of electrons of a nitrogen atom. This area in which the electron density of the HOMO is distributed becomes a hole injection site in the buffer layer 4. Accordingly, forming the buffer layer 4 with an amine-based compound allows for formation of a hole injection site in the buffer layer 4. This allows holes conducted from the hole injection layer 3 to be efficiently injected to the functional layer. The buffer layer 4 has a thickness of 20 nm, for example.

(Light-Emitting Layer 5)

The light-emitting layer 5 is formed with F8BT ((poly(9,9-di-noctylfluorene-alt-benzothiadiazole)), which is an organic polymer. However, the light-emitting layer 5 is not necessarily formed with F8BT, and may be formed with a well-known organic material. For example, the light-emitting layer 5 may be formed with a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group III metal, metal complex of oxine, rare earth metal complex, etc., as recited in Japanese Patent Application Publication No. H5-163488. The light-emitting layer 5 has a thickness of 70 nm, for example.

(Cathode 6)

For example, the cathode 6 is made up of a sodium fluoride layer 6a having a thickness of 5 nm and an aluminum layer 6b having a thickness of 100 nm. However, it is not limited to such, and the cathode 6 may be made up of a single metal film.

(Bank Layer 12)

A bank layer 12 is formed with a photoresist material such as acrylic resin. However, it is nut limited to such, and the bank layer 12 may be formed with ail organic insulative material such as polyimide resin or novolac phenolic resin.

2. Outline of Method for Manufacturing Organic EL Element 1

The following describes an example of an overall method for manufacturing the organic EL element 1.

First, the substrate 10 is mounted inside a chamber of a sputtering film-forming apparatus. Then, a predetermined sputtering gas is introduced into the chamber, and, according to a reactive sputtering method using an ITO film as a sputtering target, the anode 2 made of ITO is formed on the substrate 10.

Next, the hole injection layer 3 is formed on the anode 2. To form the hole injection layer 3, it is beneficial to employ a method with which a film of highly pure composition is easily formed. For example, such a method may be a sputtering method.

In a case where a sputtering method is employed, reactive sputtering is performed with argon gas as a sputtering gas, oxygen gas as a reactive gas, and either an NiO sintered body or metal Ni as a sputtering target. Specifically, argon gas and oxygen gas are introduced in a chamber. Then, high voltage is applied within the chamber so as to ionize argon in the argon gas and to cause the ionized argon to bombard the sputtering target. With the bombardment of the ionized argon to the sputtering target, Ni particles or $NiO_x$ particles are released from the sputtering target and then react with the oxygen gas to become $NiO_x$ having adjusted film properties. As a result, the hole-injection layer 3 made of $NiO_x$ is formed on the anode 2.

Next, ink containing an amine-based compound and a solvent is dripped onto a surface of the hole injection layer 3 by a wet process such as a spin coat method or an inkjet method. Then, the solvent is volatilized to be removed. As a result, the buffer layer 4 is formed on the hole injection layer 3.

Furthermore, ink containing an organic light-emitting material and solvent is dripped onto a surface of the buffer layer 4 in the same manner as described above. Then, the solvent is volatilized to be removed. As a result, the light-emitting layer 5 is formed on the buffer layer 4.

Note that the buffer layer 4 and the light-emitting layer 5 may be formed according to a method other than a spin coat method and an inkjet method. For example, ink may be dripped and applied according to a well-known method such as a gravure printing method, a dispenser method, a nozzle coating method, an intaglio printing, or a letterpress printing.

Finally, the sodium fluoride layer 6a and the aluminum layer 6b are formed on a surface of the light-emitting layer 5 according to a vacuum evaporation method. As a result, the cathode 6 is formed on the light-emitting layer 5.

Although not shown in FIG. 1, a sealing layer may be additionally provided on a surface of the cathode 6, in order to prevent the pair of electrodes and the various organic functional layers from being exposed to the atmosphere after completion of the organic EL element 1. Specifically, a sealing layer composed of SiN (silicon nitride), SiON (silicon oxynitride), etc., may be provided so that the organic EL element 1 is sealed from external space. Also, instead of the sealing layer, a sealing cap may be provided to isolate the entire organic EL element 1 from external space. Specifically, the sealing cap may be formed with the same material as the substrate 10, and a getter which absorbs moisture and the like may be provided within the sealed space formed by the substrate 1 and the sealing cap.

Performance of the above steps completes the organic EL element 1.

3. Film Forming Conditions of Hole Injection Layer 3

(Outline)

The following describes an outline of the film forming conditions of the hole injection layer 3. In the present embodiment, an $NiO_x$ film which constitutes the hole injection layer 3 is formed under predetermined film forming conditions. As a result, in the hole injection layer 3, the ratio of the number of atoms of $Ni^{3+}$ to the number of atoms of $Ni^{2+}$ becomes equal to or greater than 60%.

Specifically, the hole injection layer 3 may be formed by a sputtering method using an RF (Radio Frequency) magnetron sputtering device with NiO as the sputtering target. During the sputtering, the substrate temperature is not controlled, and the gas introduced into the chamber is composed of either argon gas or a mixture of argon gas and oxygen gas.

Regarding this film forming method, it was found that the hole injection efficiency of the hole injection layer improves more as the total pressure in the chamber becomes larger than 2.0 Pa and the input power density becomes smaller than 4.93 $W/cm^2$. Accordingly, when the organic EL element including the hole injection layer is driven, the hole injection efficiency of the organic EL element as a whole is also improved. Regarding this finding, the following provides more details.

(Experiment Using Hole-Only Device)

To confirm the validity of the aforementioned film forming conditions, assessment was conducted on the degree to which the hole conduction efficiency from the anode 2 to the hole injection layer 3 depends on the film forming conditions. As an assessment device, a hole-only device (HOD) 1B as shown in FIG. 2 was manufactured.

Figure 2:
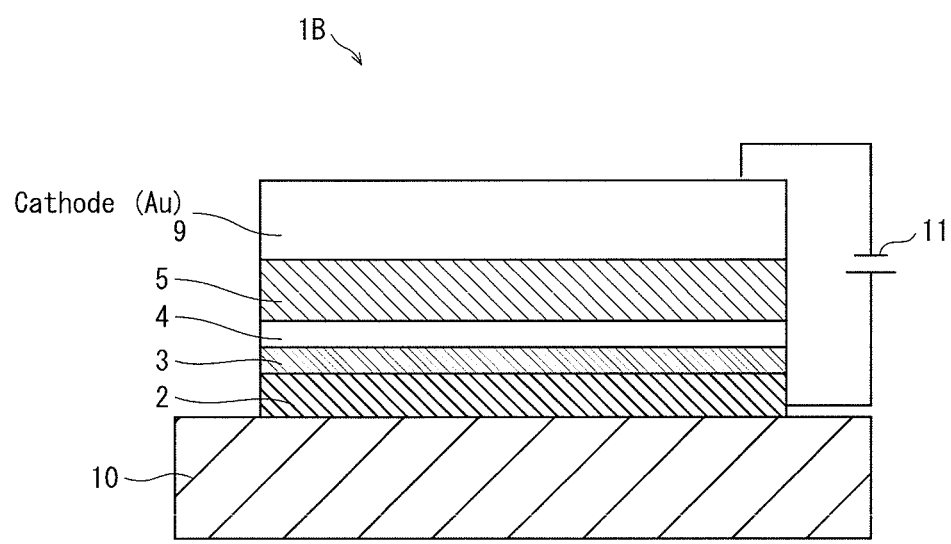
FIG. 2 is a schematic cross-sectional view showing the structure of a hole-only device.

As shown in FIG. 2, the hole-only device 1B is basically the same as the organic EL element 1 in FIG. 1, except that the cathode 6 is replaced by a cathode 9 composed of gold. Specifically, the hole-only device 1B includes the following layered on a substrate 10 in the stated order: an anode 2 composed of a thin ITO film with a thickness of 50 nm; a hole injection layer 3 composed of $NiO_x$ and having a thickness of 10 nm, a buffer layer 4 composed of TFB and having a thickness of 20 nm; a light-emitting layer 5 composed of F8BT and having a thickness of 70 nm; and a cathode 9 composed of gold and having a thickness of 100 nm. Also, in the manufacturing process of the hole-only device 1B, the hole injection layer 3 was formed by a sputtering method using an RF magnetron sputtering device or by an electron beam evaporation method in a high vacuum chamber.

In the organic EL element 1 that actually operates, the carriers constituting electric current include both holes and electrons. Accordingly, the electrical properties of the organic EL element 1 reflect not only hole current, but also electron current. On the other hand, in the hole-only device 1B, carriers constituting electric current are almost entirely holes. This is because the cathode in the hole-only device 1B is made of gold, and the injection of electrons from the cathode is blocked. Since carriers constituting electric current are considered to be almost entirely holes, the hole-only device 1B can be used to assess hole injection efficiency.

(Film Forming Conditions of Hole Injection Layer)

Table 1 shows the film forming conditions of the hole injection layer 3. In film forming conditions A, B, and C, the film forming method is a sputtering method. In film forming conditions D, the film forming method is an electron beam evaporation method.

TABLE 1

| | Film forming method | Total pressure (Pa) | Oxygen partial pressure (%) | Input power density ($W/cm^2$) |
|---|---|---|---|---|
| Film forming condition A | Sputtering | 8.0 | 50 | 2.47 |
| Film forming condition B | Sputtering | 8.0 | 0 | 2.47 |
| Film forming condition C | Sputtering | 2.0 | 0 | 4.93 |
| Film forming condition D | Electron beam evaporation | — | — | — |

In the sputtering method under the film forming conditions A, B, and C, the gas introduced into the chamber was composed of at least one of argon gas and oxygen gas, and the sputtering target used was an NiO sintered body. The substrate temperature was not controlled, whereas the total pressure was adjusted by varying the flow amount of each gas. In the electron beam evaporation method under the film forming conditions D, the evaporation source used was a sintered NiO tablet, and the hole injection layer 3 was formed in a high vacuum at a vacuum degree of approximately $5 \times 10^{-5}$ Pa and an evaporation rate of approximately 0.1 Å/seconds.

Hereinafter, among the film forming conditions A, B, C, and D, the hole-only device 1B including a hole injection layer formed under the film forming conditions A is referred to as HOD-A, the hole-only device 1B including a hole injection layer formed under the film forming conditions B is referred to as HOD-B, the hole-only device 1B including a hole injection layer formed under the film forming conditions C is referred to as HOD-C, and the hole-only device 1B including a hole injection layer formed under the film forming conditions D is referred to as HOD-D.

(Outline of Assessment of Hole Injection Efficiency of Hole-Only Devices)

The following experiments were conducted for the assessment of the hole injection efficiency of each of the hole-only devices. The experiments were conducted by connecting the hole-only devices manufactured under the respective film forming conditions A to D to the direct current power supply 11. At this time, voltage applied to the hole-only devices is changed to measure electric current values. Each of the electric current values is then converted to an electric current density which is an electric current value per unit area. With use of these values, a relation curve between applied voltage and electric current density was created for each hole-only device.

Here, it is considered that the driving voltage to the organic EL element depends on the hole injection efficiency of the hole injection layer. This is because the manufacturing methods of the respective hole-only devices are basically the same except for the film forming conditions of the hole injection layer 3. In other words, a process for forming the other layers is the same in each of the manufacturing methods. Accordingly, except for the hole injection layer 3, the magnitude of the energy barrier during injection of holes at the interface between two adjacent layers is considered to be constant.

Also, the following has been confirmed in an experiment differing from the present experiments. That is, in any hole-only device formed under any of the film forming conditions, the energy level of the hole injection layer 3 is in alignment with the energy level of the buffer layer 4 at the interface therebetween. As a result, the energy barrier at the interface is almost non-existent. The alignment of the energy levels at the interface occurs since the upper end of the valence band of the $NiO_x$ that constitutes the hole injection layer 3 includes a large amount of Ni3d component in a partially occupied state. Since the energy levels are in alignment at the interface as described above, the hole injection efficiency at the interface is considered to b extremely high. Accordingly, the differences in the hole injection efficiency of the hole injection layer 3 resulting from the differences in the film forming conditions strongly reflect the hole injection efficiency from the anode 2 to the hole injection layer 3.

Figure 3:
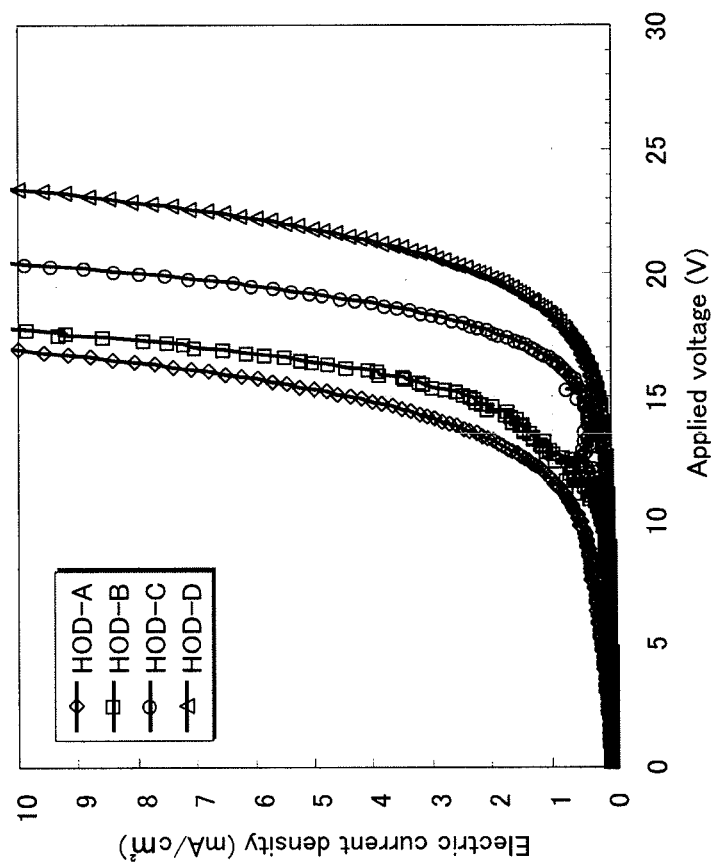
FIG. 3 is a device characteristics diagram showing relation curves each illustrating a relation between applied voltage and current density of a hole-only device.

FIG. 3 is a device characteristics chart showing the relation curve between applied voltage and electric current density in each hole-only device. In FIG. 3, the vertical axis represents electric current density ($mA/cm^2$), and the horizontal axis represents applied voltage (V). As shown in FIG. 3, electric current density in each hole-only device when the same voltage is applied thereto tends to increase in the order of the film forming conditions D, C, B, and A.

Table 2 shows the driving voltage for each of the samples HOD-A to HOD-D yielded by the experiment. Note that the driving voltage of the samples HOD-A to HOD-D is assumed to be the "voltage applied to the samples HOD-A to HOD-D to realize an electric current density with a specific, practical value of 10 $mA/cm^2$".

TABLE 2

|  | Driving voltage (V) |
| --- | --- |
| HOD-A | 16.9 |
| HOD-B | 17.7 |
| HOD-C | 20.4 |
| HOD-D | 23.4 |

As shown in Table 2, the driving voltages in the HOD-A, HOD-B, HOD-C, and HOD-D are 16.9 V, 17.7 V, 20.4 V, and 23.4 V, respectively. In other words, the driving voltage tends to decrease in the order of the film forming conditions D, C, B, and A. The decrease in the driving voltage is due to the improvement in the hole injection efficiency of each hole-only device, which allows for a desired electric current density with less driving voltage. As can be seen in Table 2, the HOD-A and the HOD-B have higher hole injection efficiency than the HOD-C and the HOD-D.

4. Study of Position of Upper End of Valence Band in Hole Injection Layer (Mechanism of Improvement of Hole Injection Efficiency Caused by Change in Film Forming Condition)

It is considered that the hole injection efficiency in the hole-only device 1B is affected by a change in the film forming conditions of the hole injection layer. The following analyzes in detail the mechanism of improvement of hole injection efficiency caused by the change in the film forming conditions.

Figure 4:
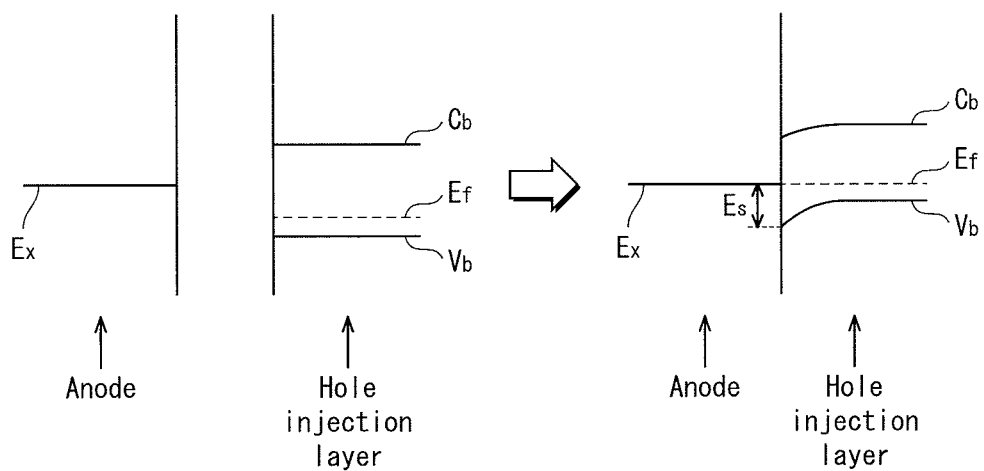
FIG. 4 illustrates a Schottky barrier at the interface between an anode and a hole injection layer.

FIG. 4 illustrates a Schottky barrier at the interface between the anode 2 and the hole injection layer 3. The left part of FIG. 4 shows the state before the anode 2 is joined to the hole injection layer 3. The right part of FIG. 4 shows the state after the anode 2 is joined to the hole injection layer 3. In FIG. 4, Ex represents a Fermi level of ITO, Cb represents a lower end of a conduction band of the hole injection layer, Ef represents a Fermi level of the hole injection layer, and Vb represents an upper end of the valence band of the hole injection layer.

In the hole-only device 1B, $NiO_x$ that constitutes the hole injection layer 3 is in contact with ITO that constitutes the anode 2. Due to this contact, electric charge is transferred at the interface between the ITO and the $NiO_x$. As a result, a Schottky barrier Es is generated at the interface as shown in FIG. 4. Here, in order for holes to move from the Fermi level $E_x$ of the ITO to the upper end of the valence band Vb of the NiO across the Schottky barrier Es, it is beneficial to apply voltage to the organic EL element 1 as described above.

Here, it should be noted that the higher the upper end of valence band Vb of the $NiO_x$ in terms of the energy level, the smaller the Schottky barrier Es. Also, the smaller the Schottky barrier Es, the more holes can cross over the Schottky barrier Es even when the same voltage is applied to the organic EL element. In other words, the higher the upper end of valence band Vb of the $NiO_x$ in terms of the energy level, the smaller the Schottky barrier Es, and therefore hole injection efficiency is further improved.

The $NiO_x$ constituting the hole injection layer 3 mainly includes $Ni^{2+}$ and $Ni^{3+}$. In the hole injection layer 3, an atom ratio $Ni^{3+}/Ni^{2+}$ is considered to differ depending on the film forming conditions. Here, the atom ratio $Ni^{3+}/Ni^{2+}$ is the ratio of the number of nickel atoms with a valence of three to the number of nickel atoms with a valence of two, and is expressed in percentage. Note that an $Ni^{3+}$ atom has a higher electric charge than an $Ni^{2+}$ atom by one. Accordingly, increasing the atom ratio $Ni^{3+}/Ni^{2+}$ can effectively increase the number of holes doped in the hole injection layer 3. When the atom ratio $Ni^{3+}/Ni^{2+}$ increases, the upper end of the valence band of $NiO_x$ shifts toward a higher energy level.

(XPS Measurement of $NiO_x$)

To confirm the effect in which an increase of the atom ratio $Ni^{3+}/Ni^{2+}$ causes a shift of the upper end of the valence band to a higher energy level, an X-ray photoelectron spectroscopy (XPS) measurement was conducted on the $NiO_x$ films formed under the film forming conditions A to D.

(XPS Measurement Conditions)

Device used: PHI 5000 VersaProbe X-ray Photoelectron Spectroscopy Device (manufactured by ULVAC-PHI, Inc.)

Light source: Al Kα

Photoelectron emission angle: Normal line direction of the substrate surface

Interval between measurement points: 0.1 eV (Specific Measurement Method)

First, samples for XPS measurement were manufactured under the film forming conditions A to D shown in Table 1. Specifically, on an ITO conductive substrate formed on a glass plate, the hole injection layer 3 was formed to have a thickness of 10 nm under the film forming conditions A to D. The results were taken as samples for XPS measurement. The samples for XPS measurement manufactured under the film forming conditions A to D are hereinafter respectively referred to as sample A, sample B, sample C, and sample D. XPS measurement was then performed on the surface of the hole injection layer 3 in each of the samples A to D.

(Peak Assignment of O1s Spectrum)

First, an examination was conducted on the atom ratio $Ni^{3+}/Ni^{2+}$ in the hole injection layer 3. The examination on the atom ratio $Ni^{3+}/Ni^{2+}$ was conducted by classifying the peaks obtained as a result of an analysis on the O1s spectrum into (i) a peak of an O1s level of oxygen atoms coordinating to an $Ni^{2+}$ atom and (ii) a peak of an O1s level of oxygen atoms coordinating to an $Ni^{3+}$ atom. The following describes the examination in more details.

Figure 5:
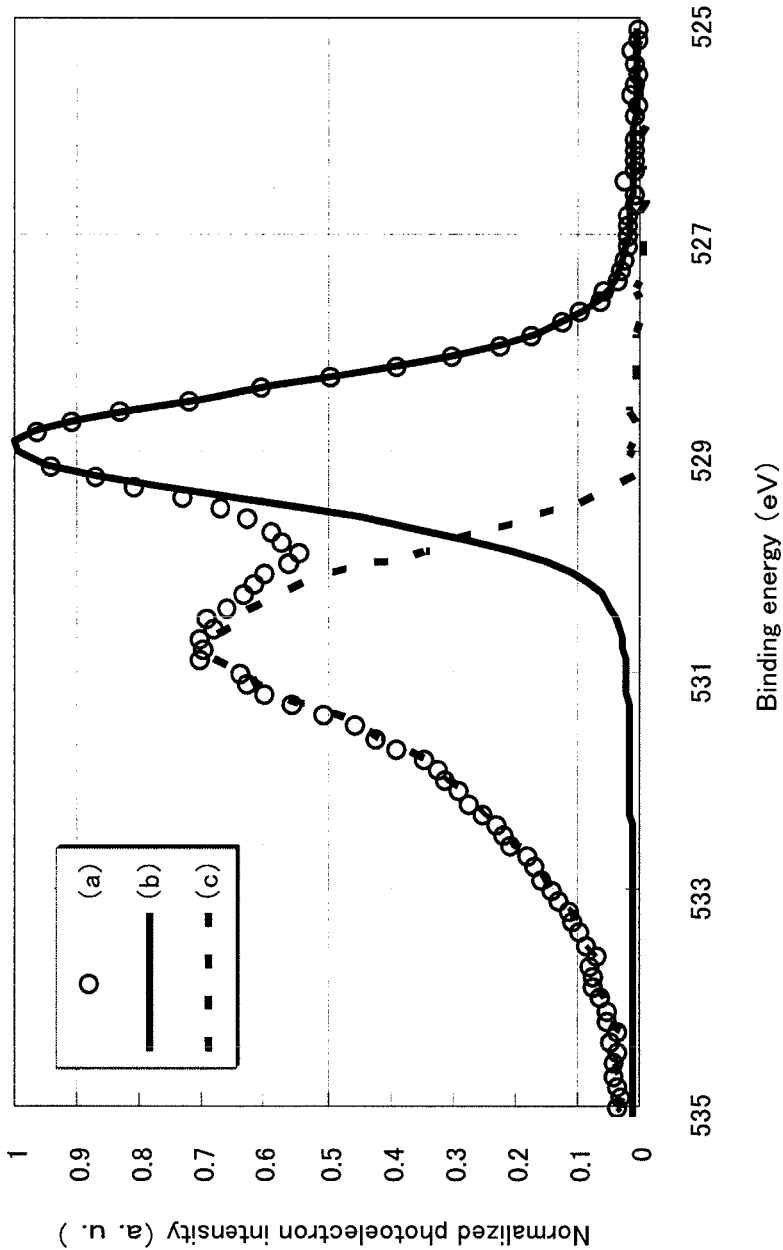
FIG. 5 shows a spectrum belonging to O1s obtained as a result of XPS measurement at a surface of an $NiO_x$ film and the result of the peak fitting analysis.

FIG. 5 shows a spectrum belonging to O1s obtained as a result of XPS measurement at a surface of the $NiO_x$ film and the result of the peak fitting analysis.

The curve (a) in FIG. 5 shows a spectrum of an oxygen atom at the O1s level in the sample A.

In FIG. 5, the horizontal axis represents binding energy, which corresponds to the energy of the photoelectrons at each energy level with the X-ray as a reference. The left direction with respect to the origin is positive. In other words, the binding energy represented by the horizontal axis is the energy of the photoelectrons at each energy level when the energy of AlKα X-ray (1486.6 eV) is assumed to be zero. Also, in FIG. 5, the vertical axis represents photoelectron intensity and corresponds to a relative value of the number of individually measured photoelectrons.

As shown in the curve (a) in FIG. 5, a first peak is measured in the vicinity of a binding energy of 529 eV, and a second peak is measured at a position where the binding energy is relatively higher than at the first peak. In a direction from right to left in FIG. 5, the first peak belongs to the O1s level of oxygen atoms coordinating to an $Ni^{2+}$ atom, and the second peak belongs to the O1s level of oxygen atoms coordinating to an $Ni^{3+}$ atom.

(Peak Fitting Analysis of O1s Spectrum)

The area ratio between these peaks constituting the O1s spectrum reflects the abundance ratio between $Ni^{3+}$ atoms and $Ni^{2+}$ atoms (i.e., atom ratio $Ni^{3+}/Ni^{2+}$) among the Ni atoms within the measurement range. Accordingly, in order to examine the atom ratio $Ni^{3+}/Ni^{2+}$ by determining the area ratio between these peaks, peak fitting analysis was first conducted on the peak belonging to an $Ni^{2+}$ atom as follows. Specifically, the peak fitting analysis was performed with use of "PHI Multipak", which is software for photoelectron spectroscopy analysis.

First, in the range in which the binding energy of O1s spectrum is 525 eV to 535 eV, the background was subtracted by Shirley method. Then, the photoelectron intensity represented by the vertical axis was normalized under the following conditions: the value of the maximum photoelectron intensity within the range in which the binding energy is from 528 eV to 530 eV is set to "1"; and the value of photoelectron intensity when the binding energy is 525 eV is set to "0". Note that the photoelectron intensity in FIGS. 5 and 6 indicates this normalized value unless otherwise specified.

Next, the binding energy at a peak top in a fitting function of a component that belongs to oxygen atoms coordinating to an $Ni^{2+}$ atom (hereinafter "$Ni^{2+}$ component") is referred to as "the binding energy when the photoelectron intensity in the O1s spectrum is at a maximum in the range of 528 eV to 530 eV". Also, the intensity of the peak top in the fitting function is set to "1". Also, the difference between (i) the binding energy when the normalized photoelectron intensity is 0.5 in an area that extends in the low binding energy direction from the peak top of the $Ni^{2+}$ component and (ii) the binding energy at the peak top of the $Ni^{2+}$ component is referred to as the half width at half maximum of the fitting function of the $Ni^{2+}$ component. The fitting function used here is a mixed function of Gaussian function and Lorentzian function. The mixture ratio of the Gaussian function in the entire mixed function, expressed in percentage, was fixed to 85%. As a result, the fitting function of the $Ni^{2+}$ component as shown as a curve (b) of FIG. 5 was obtained.

Furthermore, the area of the function used for the fitting of the $Ni^{2+}$ component is subtracted from the total area of photoelectron intensity when the binding energy is from 525 eV to 535 eV. A resulting area obtained by the subtraction is referred to as the area of the $Ni^{3+}$ component as shown in a curve (c) of FIG. 5.

The XPS measurement at the surface of the $NiO_x$ film and the peak fitting analysis of the O1s spectrum as described above were conducted on the samples B, C, and D, similarly to the sample A.

Figure 6:
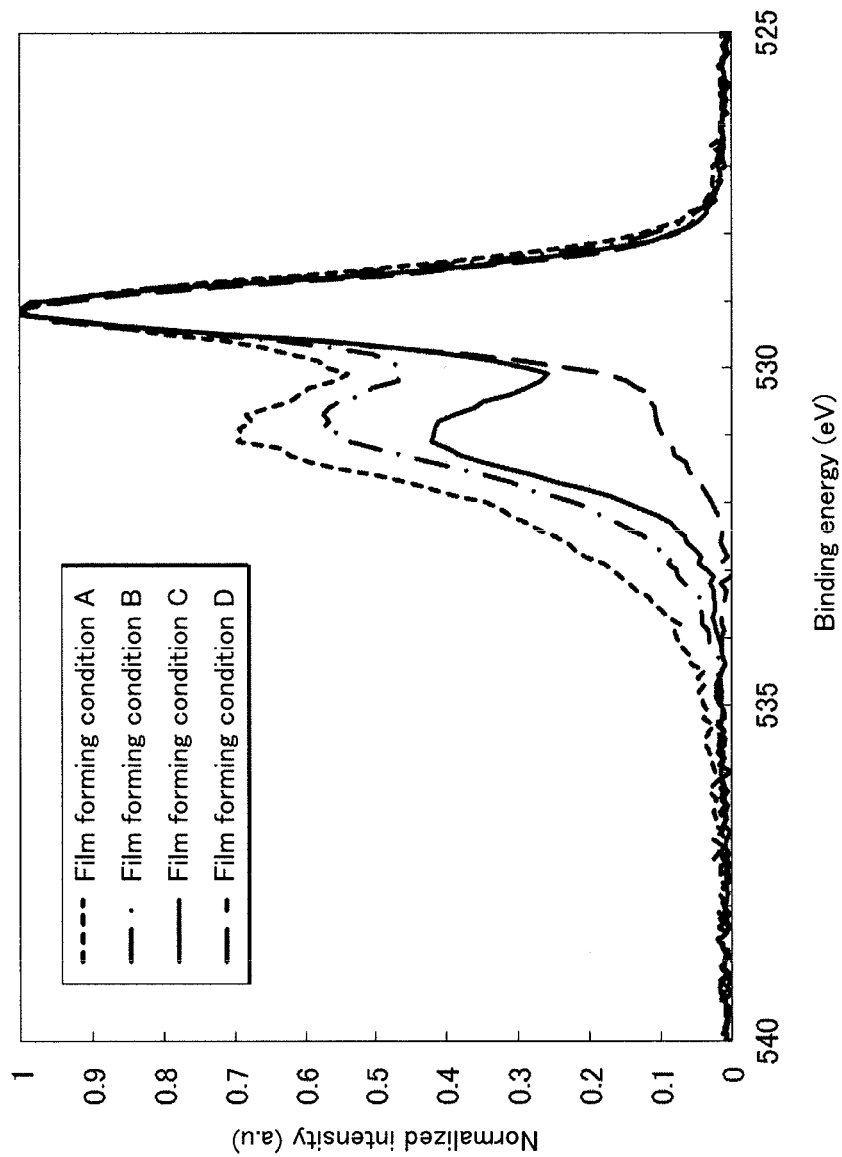
FIG. 6 shows spectra each belonging to the O1s obtained as a result of XPS measurement at the surface of the $NiO_x$ film.

FIG. 6 shows the spectra each belonging to the O1s spectrum obtained as a result of XPS measurement at the surface of the $NiO_x$ film. The atom ratio $Ni^{3+}/Ni^{2+}$ of each of the samples A to D obtained from the spectra in FIG. 6 is shown in Table 3.

TABLE 3

| | $Ni^{3+}/Ni^{2+}$ (%) |
|---|---|
| Film forming condition A | 105.9 |
| Film forming condition B | 79.1 |
| Film forming condition C | 55.2 |
| Film forming condition D | 6.2 |

As shown in Table 3, the atom ratio $Ni^{3+}/Ni^{2+}$ is the largest in the sample A, decreases in the order of the sample B and the sample C, and is the smallest in the sample D. Based on this result, regarding the film forming conditions A to D, it can be said that $Ni^{3+}/Ni^{2+}$ tends to increase as (i) the total pressure becomes larger, (ii) the total pressure in the chamber becomes larger than 2.0 Pa, and (iii) the input power density becomes smaller than 4.93 W/cm².

(Analysis of Spectrum at Upper End of Valence Band of $NiO_x$)

Next, in order to examine the upper end of the valence band in the $NiO_x$ constituting the hole injection layer, the spectrum at the upper end of the valence band of the $NiO_x$ was analyzed.

Figure 7:
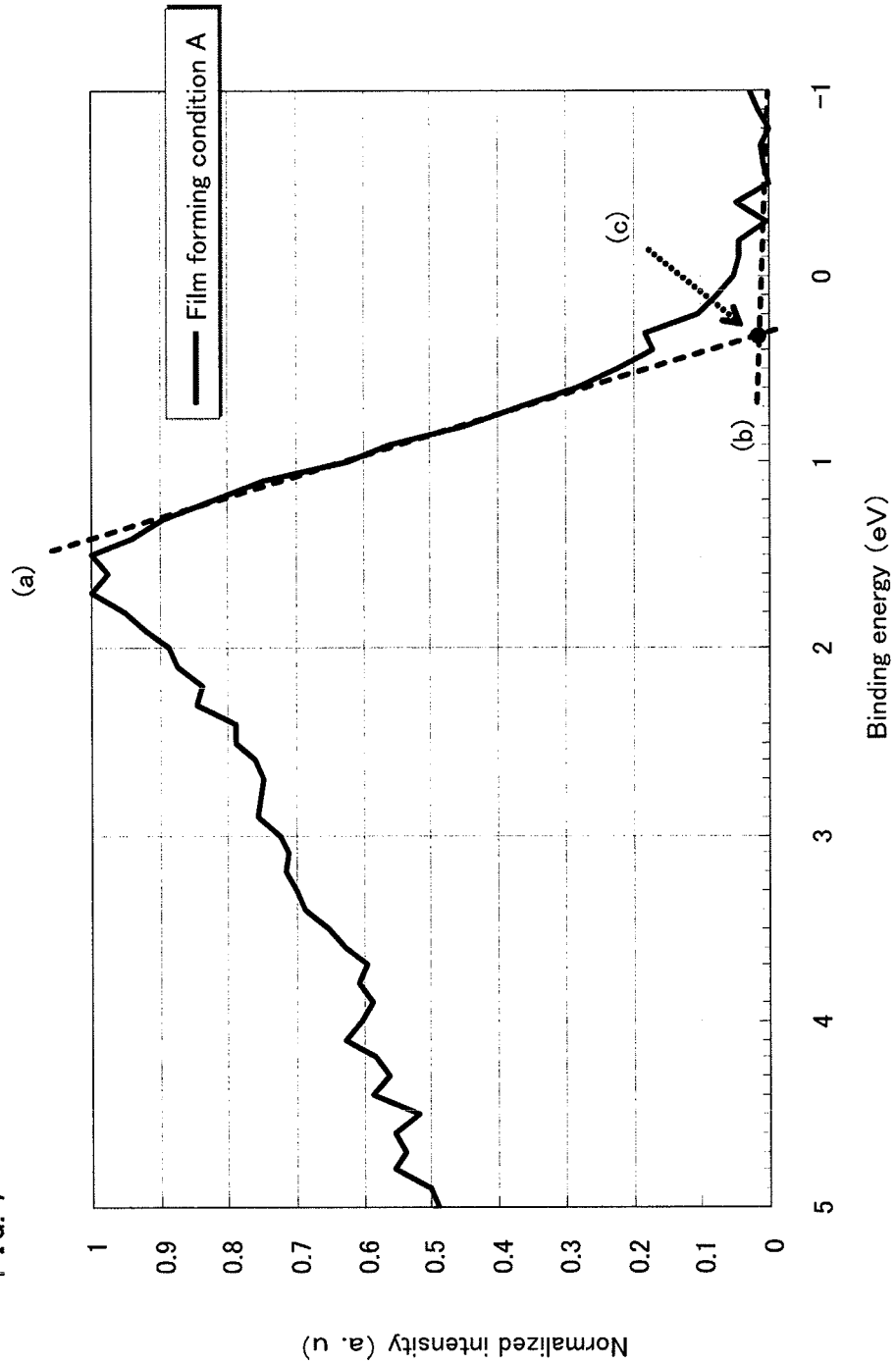
FIG. 7 shows the XPS spectrum in the vicinity of the valence band of the surface of the $NiO_x$ film.

FIG. 7 shows the XPS spectrum in the vicinity of the valence band of the $NiO_x$ in the sample A. The following can be read from the XPS spectrum in FIG. 7: the binding energy at the upper end of the valence band of the $NiO_x$ and the position of the upper end of the valence band of the $NiO_x$. Details are described below.

In general, an XPS spectrum of $NiO_x$ indicates a distinct, rapid rise which can be uniquely distinguished from other areas thereof. Here, a tangential line passing through an inflection point of the above rise is referred to as line (a), and an auxiliary line of a background line in an area that extends further in the low binding energy direction than the start of the above rise is referred to as line (b). Provided that a point at which the tangential line (a) and the auxiliary line (b) intersect is intersection point (c), the intersection point (c) can be read as the binding energy at the upper end of the valence band.

Figure 8:
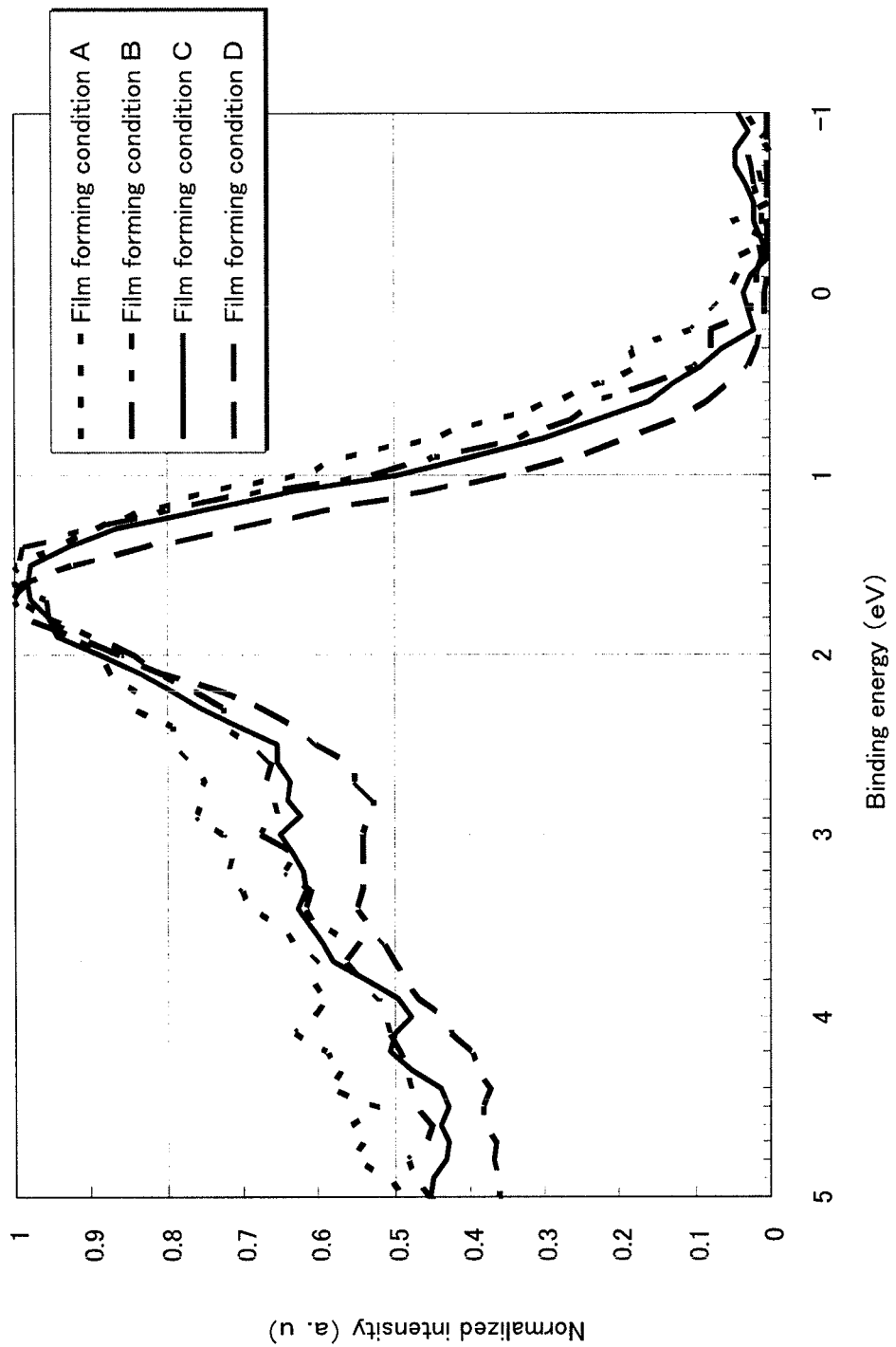
FIG. 8 shows the XPS spectra each being in the vicinity of the valence band of the surface of the $NiO_x$ film.

FIG. 8 shows the XPS spectrum in the vicinity of the valence band of the surface of the $NiO_x$ film in each of the samples A to D. With use of the above method, the binding energy at the upper end of the valence band in each of the samples A to D was read from the XPS spectra in FIG. 8. In FIG. 8, the binding energy represented by the horizontal axis is the energy of the photoelectrons at each energy level when the Fermi level of the $NiO_x$ in each sample is assumed to be a reference (zero).

Table 4 shows values read from FIG. 8, the values each being of the binding energy at the upper end of the valence band in the $NiO_x$ film in one of the samples A to D.

TABLE 4

| | Binding energy at the upper end of the valence band (eV) |
|---|---|
| Film forming condition A | 0.31 |
| Film forming condition B | 0.56 |
| Film forming condition C | 0.62 |
| Film forming condition D | 0.74 |

The binding energy at the upper end of the valence band is the smallest in the sample A, increases in the order of the sample B and the sample C, and is the largest in the sample D.

Based on the above results, it was found that when the atom ratio $Ni^{3+}/Ni^{2+}$ of the $NiO_x$ is increased, the binding energy at the upper end of the valence band of the $NiO_x$ decreases. Note that the smaller the binding energy at the upper end of the valence band of the $NiO_x$, the higher the upper end of the valence band of the $NiO_x$ in terms of the energy level. Accordingly, it is considered that by increasing the atom ratio $Ni^{3+}/Ni^{2+}$ of the $NiO_x$, the upper end of the valence band of the $NiO_x$ becomes higher in terms of the energy level, resulting in the Schottky barrier at the interface between the anode and the hole injection layer being small. This is considered to further improve the hole injection efficiency in the hole-only device 1B.

6. Advantageous Effects

Thus far, the description has been provided on the assessment on the hole injection efficiency of the hole injection layer 3 in the hole-only device 1B. Note that except for the cathode 9, the hole-only device 1B has the same structure as the organic EL element 1 shown in FIG. 1 which actually operates. Therefore, the dependence of the hole injection efficiency from the anode 2 to the hole injection layer 3 on the film forming conditions is considered to be the same between the organic EL element 1 and the hole-only device 1B. Accordingly, in the organic EL element 1, it is considered that by increasing the atom ratio $Ni^{3+}/Ni^{2+}$ of the $NiO_x$ the binding energy at the upper end of the valence band becomes smaller, resulting in the hole injection efficiency being improved. The following describes the range within which the effect of the present is can be, achieved.

Figure 9:
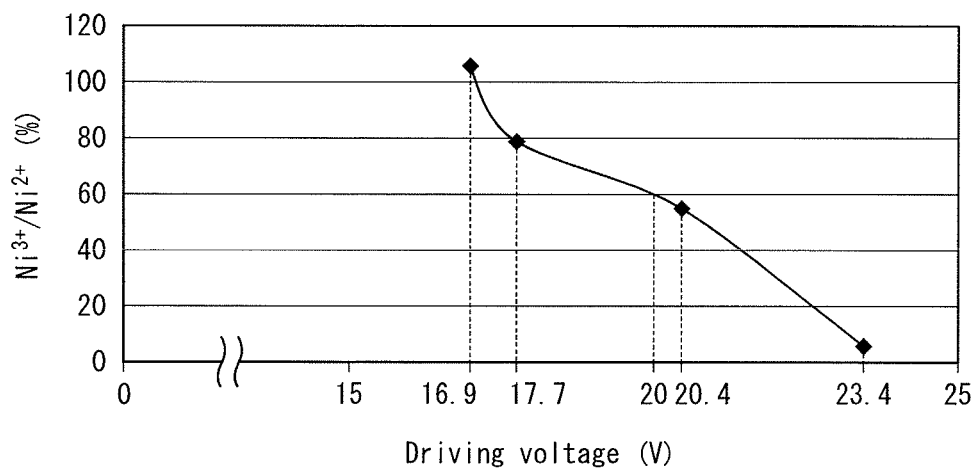
FIG. 9 shows the relationship between the driving voltage of the hole-only device and an atom ratio $Ni^{3+}/Ni^{2+}$.

FIG. 9 shows the relationship between the driving voltage of the hole-only device 1B and the atom ratio $Ni^{3+}/Ni^{2+}$. In FIG. 9, the horizontal axis represents the driving voltage of the hole-only device 1B, and the vertical axis represents the atom ratio $Ni^{3+}/Ni^{2+}$.

As shown in FIG. 9, the larger the atom ratio $Ni^{3+}/Ni^{2+}$ the smaller the driving voltage of the hole-only device 1B. The driving voltage of the organic EL element 1 is approximately 20 V, depending on the structure of a device including the organic EL element 1. Accordingly, the driving voltage equal to or less than 20 V is considered to be smaller than the driving voltage of a conventional organic EL element. In order for the organic EL element 1 to achieve such driving voltage, the atom ratio $Ni^+/Ni^{2+}$ in the hole injection layer 3 needs to be equal to or greater than 60%. In this way, the driving voltage of the organic EL element 1 decreases as shown in FIG. 9, resulting in the hole injection efficiency being improved. In particular, it is beneficial that the atom ratio $Ni^{3+}/Ni^{2+}$ in the hole injection layer 3 is equal to or greater than 79.1%, since the driving voltage further decreases to 17.7V or less, and the hole injection efficiency is further improved.

Furthermore, from the above experiments, it was confirmed that the driving voltage is decreased by forming the hole injection layer under a condition within the range of the film forming conditions A and B. As described above, the organic EL element 1 can reduce the magnitude of the Schottky barrier between the anode 2 and the hole injection layer 3, thus reducing the driving voltage. This reduces the load imposed on the organic EL element 1 during driving thereof, thereby promising an increase in the operating lifetime of the organic EL element 1.

[Modifications]

The organic EL element according to one aspect UI the present disclosure is not limited to being used as a single element. The organic EL element may be provided in a plurality and the plurality of organic EL elements may be integrated on a substrate as pixels to form an organic EL light-emitting apparatus. Such an organic EL light-emitting apparatus can be achieved by appropriately setting the thickness of each layer in the respective organic EL elements, and may be used as an illumination device or the like, for example.

1. Manufacturing Method for Organic EL Element

When the light-emitting layer of each pixel is formed by an application process such as an inkjet process, it is beneficial to form banks on the hole injection layer to separate the pixels. Forming banks prevents inks composed of light-emitting layer material of different colors from mixing together during the application process. For example, the banks are formed by applying bank material composed of photosensitive resist material onto a surface of the hole injection layer, pre-baking the bank material, exposing the bank material to light with a pattern mask, washing off unhardened, excess bank material with a developer, and finally rinsing with pure water. The present disclosure is applicable to the hole injection layer composed of metal oxide having undergone the bank forming step as described above.

2. Layer Structure of Organic EL Element

The organic EL element according to one aspect of the present disclosure may be a so-called bottom emission type or a top emission type.

3. Film Forming Conditions of Hole Injection Layer

In the above embodiment, the condition concerning input power in each of the film forming conditions A, B, and C is represented in terms of input power density, as shown in Table 1. Note that when using an RF magnetron sputtering device differing from the RF magnetron sputtering device used in the present experiment, the input power density may be adjusted according to the size of the magnet at a back surface of the sputtering target so that the input power density fulfills the above condition. This yields the hole injection layer 3 composed $NiO_x$ with excellent hole injection efficiency, as in the present experiment. Conditions on total pressure and oxygen partial pressure, on the other hand, are independent of the device, the size of the target, and the magnet size of the target.

Additionally, during forming of the hole injection layer according to the sputtering method, the substrate temperature was not intentionally adjusted in the sputtering device placed under room temperature. Therefore, the substrate was at room temperature at least before the forming of the hole injection layer. However, during the formation of the hole injection layer, the substrate temperature may rise by several tens of degrees Celsius.

Note that the hole injection layer 3 is not necessarily formed by the sputtering method or the evaporation method. For example, the hole injection layer 3 may be formed by a well-known method such as CVD (Chemical Vapor Deposition) method.

4. Material of Hole Injection Layer

In the above embodiment, etc., the hole injection layer is formed from $NiO_x$. However, the hole injection layer may be formed from an oxide of the transition metal atom M other than Ni. Examples of the transition metal atom M other than Ni include scandium (Sc), titanium (Ti), vanadium (V), chromium (Cr), manganese (Mn), iron (Fe), cobalt (Co), and copper (Cu) which take a first valence and a second valence.

For example, suppose that the transition metal atom M is either Ni or Co. In this case, increasing the ratio $M^{3+}/M^{2+}$ can reduce the binding energy at the upper end of the valence band of an oxide film $MO_x$, which is a film including the transition metal atom M. Also, suppose that the transition metal atom M is Cr. In this case, increasing the ratio $Cr^{4+}/Cr^{3+}$ can reduce the binding energy at the upper end of the valence band of the oxide film $MO_x$.

5. Application Example of Organic EL Element

Figure 10:
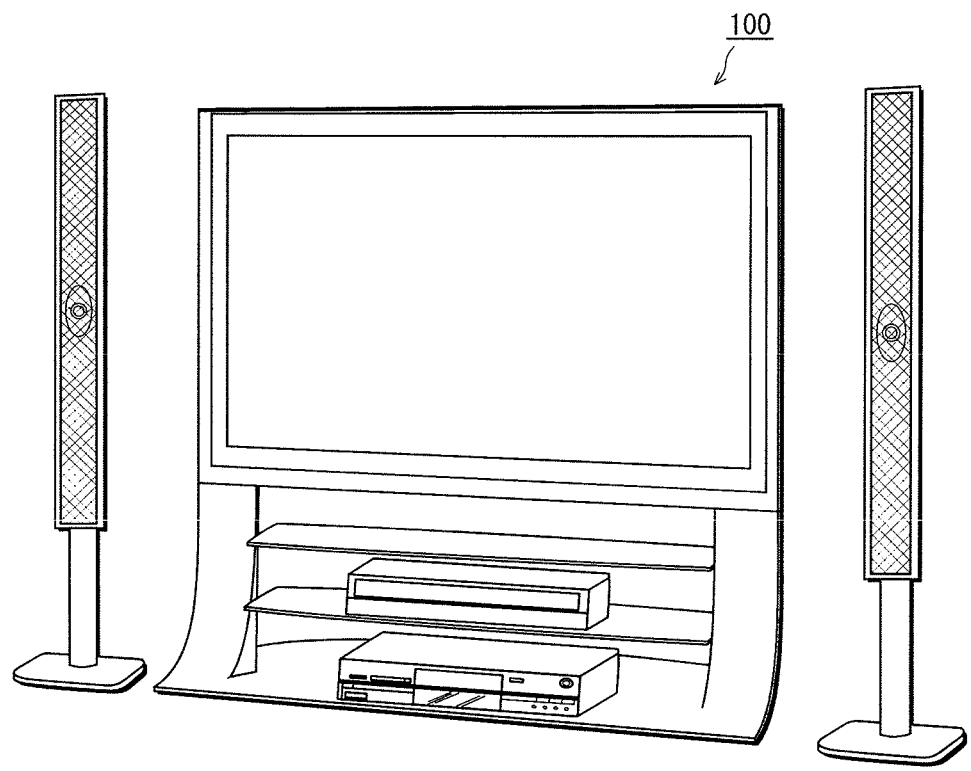
FIG. 10 is an outline view of an organic EL display apparatus including the organic EL element shown in FIG. 1.

The organic EL element according to one aspect of the present disclosure is applicable to an organic EL panel 100 as shown in FIG. 10. The organic EL element is also applicable to an organic EL light-emitting apparatus and an organic EL display apparatus. Application of the organic EL element to an apparatus such as the organic EL panel, the organic EL light-emitting apparatus, or the organic EL display apparatus allows the apparatus to realize low driving voltage and excellent light-emitting properties.

The organic EL panel may include a single organic EL element. Alternatively, the organic EL panel may include a plurality of organic EL elements that correspond to red, green, and blue pixels, or may include organic EL elements that emit the same color. The organic EL light-emitting apparatus may be used as an illumination device or the like, for example. The organic EL display apparatus may be used as an organic EL display or the like, for example.

INDUSTRIAL APPLICABILITY

The organic EL element pertaining to the present disclosure may be favorably used in: various display apparatuses for home use, for public use, and for business use; televisions; displays for portable electronic devices; and the like.

REFERENCE SIGNS LIST 1. organic EL element
1B hole-only device
2 anode
3 hole injection layer
4 buffer layer (functional layer)
5 light-emitting layer (functional layer)
6 cathode
6a sodium fluoride layer
6b aluminum layer
9 cathode (Au layer)
10 substrate
11 direct current power supply
12 bank layer

What is claimed is:

1. An organic EL element, comprising:
an anode;
a cathode;
an organic functional layer between the anode and the cathode, the organic functional layer including an organic material;
a metal oxide layer between the anode and the organic functional layer, the metal oxide layer including a nickel oxide including both nickel atoms with a valence of three and nickel atoms with a valence of two, wherein
in the metal oxide layer, a ratio of the number of nickel atoms with a valence of three to the number of nickel atoms with a valence of two, expressed in percentage, is equal to or greater than 79.1%.

2. The organic EL element of claim 1, wherein
the organic material in the organic functional layer is an amine-based compound.

3. The organic EL element of claim 1, wherein
the organic functional layer is one of a light-emitting layer, a hole transporting layer, and a buffer layer, the light-emitting layer emitting light as a result of recombination of holes and electrons, the holes being injected from the anode via the metal oxide layer, and the electrons being injected from the cathode, the hole transport layer transporting the holes injected from the metal oxide layer to the light-emitting layer, and the buffer layer preventing the electrons injected from the cathode from entering the anode.

4. An organic EL panel including the organic EL element of claim 1 in a plurality.

5. An organic EL light-emitting apparatus including the organic EL element claim 1.

6. An organic EL display apparatus including the organic EL element of claim 1 in a plurality.

* * * * *